(12) United States Patent
Nakanishi

(10) Patent No.: US 7,068,247 B2
(45) Date of Patent: Jun. 27, 2006

(54) DISPLAY DEVICE AND ELECTRONIC APPARATUS

(75) Inventor: Hayato Nakanishi, Nagano-Ken (JP)

(73) Assignee: Seiko Epson Corporation, Tokyo (JP)

( * ) Notice: Subject to any disclaimer, the term of this patent is extended or adjusted under 35 U.S.C. 154(b) by 336 days.

(21) Appl. No.: 10/314,946

(22) Filed: Dec. 10, 2002

(65) Prior Publication Data
US 2003/0122495 A1    Jul. 3, 2003

(30) Foreign Application Priority Data
Dec. 11, 2001 (JP) .............................. 2001-377299

(51) Int. Cl.
*G09G 3/30* (2006.01)
(52) U.S. Cl. ...................................... 345/76; 315/169.3
(58) Field of Classification Search ............ 345/76–82, 345/55, 92; 315/169.3, 582
See application file for complete search history.

(56) References Cited

U.S. PATENT DOCUMENTS

| 6,290,352 B1 | 9/2001 | Marumoto et al. |
| 6,304,670 B1 | 10/2001 | Berestov |
| 6,312,771 B1 | 11/2001 | Kashiwazaki et al. |
| 6,323,596 B1 * | 11/2001 | Ito et al. ................... 315/169.3 |
| 6,341,862 B1 | 1/2002 | Miyazaki et al. |
| 6,342,321 B1 | 1/2002 | Sakamoto et al. |
| 6,364,450 B1 | 4/2002 | Yamaguchi et al. |
| 6,380,672 B1 * | 4/2002 | Yudasaka ..................... 313/504 |
| 6,384,427 B1 * | 5/2002 | Yamazaki et al. ............ 257/59 |
| 6,386,700 B1 | 5/2002 | Akahira |
| 6,394,578 B1 | 5/2002 | Akahira et al. |
| 6,646,375 B1 * | 11/2003 | Nagano ....................... 313/582 |
| 6,815,903 B1 * | 11/2004 | Nakanishi ................ 315/169.3 |
| 2003/0146710 A1 | 8/2003 | Nakanishi |

FOREIGN PATENT DOCUMENTS

| EP | 0 984 303 A1 | 3/2000 |
| EP | 1 209 744 A2 | 5/2002 |
| JP | 11-24606 | 1/1999 |
| JP | 2000-148090 | 5/2000 |
| JP | 2000-353594 | 12/2000 |
| JP | 2000-357584 | 12/2000 |
| JP | 2001-188117 | 7/2001 |

OTHER PUBLICATIONS

U.S. Appl. No. 10/315,155, filed Dec. 10, 2002, Nakanishi.

* cited by examiner

*Primary Examiner*—Vijay Shankar
*Assistant Examiner*—Steven Holton
(74) *Attorney, Agent, or Firm*—Oliff & Berridge, PLC.

(57) ABSTRACT

The invention provides a display device and an electronic apparatus that incorporates the display device. The display device has drive control signal lines to control driving circuits and others thereof in a predetermined site of the substrate to thereby increase the effective display region of the surface of the substrate. The display device is free from, or is protected from, external influences on the drive control signals that pass through it. A predetermined matrix pattern of a bank layer and a recess region of which the recesses are spaced from each other with the banks adjacent thereto of the bank layer, are formed on a substrate. A real pixel region for display and a dummy pixel region not for display are formed in the pixel region to be a display region of the substrate. A scanning line-driving circuit to control the output of scanning signals that pass through scanning lines, and a drive control signal conduction element through which drive control signals pass to drive the scanning line-driving circuit, are also formed on the substrate. In the plan view of the substrate, the drive control signal conduction element is superimposed at least partly on the bank layer of the dummy pixel region.

16 Claims, 9 Drawing Sheets

(h)

(i)

(j)

DISPLAY DEVICE AND ELECTRONIC APPARATUS

BACKGROUND OF THE INVENTION

1. Field of Invention

The invention relates to a display device and an electronic apparatus.

2. Description of Related Art

Some related art optical display devices, such as liquid-crystal display devices and EL display devices, have a layered structure of multiple circuit elements, electrodes and liquid-crystal or EL elements layered on a substrate. For example, a type of such an EL display device has a sandwich structure of a light-emitting substance containing, light-emitting layer sandwiched between electrode layers of an anode and a cathode, in which the holes from the anode are recombined with the electrons from the cathode in the light-emitting layer having the ability of fluorescence emission. The device of the type emits light while it is not activated from its excited condition, and this is the phenomenon of the device to emit light.

A related art active matrix driving system can be used to drive the EL display device that has scanning lines aligned in rows and data lines in columns to form a matrix pattern therein and has an electrostatic capacitor element and a transistor disposed for every pixel of EL elements in the intersections of those lines. This emits light in accordance with the voltage that has been charged in the electrostatic capacitor element of every pixel while scanned for writing thereon, and keeps its light emission until the next rewriting on it.

SUMMARY OF THE INVENTION

Some display devices that are driven according the active matrix driving system as discussed above have different driving circuits, such as a driving circuit for scanning lines to impart a selected scanning pulse to every scanning line, and a driving circuit for data lines to supply a specific data signal to each data line, and control circuits to control them. In such display devices, the driving circuits and/or control circuits must be mounted on their substrate, and this causes various problems in that the substrate is large sized, and not much of the region having these circuits can be used for the display region of the devices, and the effective display region of the devices is thereby narrowed. In addition, lead lines from a predetermined supply source to the driving circuits and/or control circuits must also be mounted on the substrate, and drive control signal lines from the control circuits to the driving circuits must also be mounted on the substrate, and these elements will further narrow the effective display region of the devices.

On the other hand, the drive control signals control the operation of the display device, and external influences thereon that may cause noises to the signals and may deform the signal waves must be avoided as much as possible.

The present invention provides a display device which is free from, or is protected from, external influences on the drive control signals that pass through it, and provides an electronic apparatus equipped with such a display device. The display device of the invention provides drive control signal lines to control the driving circuits and others therein are disposed in a predetermined site of the substrate of the device to thereby increase the effective display region of the surface of the substrate.

To address or solve the problems noted above, the display device of the invention has, on its substrate, a display region that serves for display and a non-display region not for display. The display region and the non-display region are each aligned in a predetermined matrix pattern of barriers and recesses spaced from each other with the barriers adjacent thereto. The display region includes at least a first electrode layer, an essential display layer with a substance switchable for display or non-display therein and a second electrode layer that are aligned around the bottom of each recess in the recess region thereof, in that order, from the side of the substrate. The non-display region includes at least the essential display layer and the second electrode layer around the bottom of each recess of the recess region, in that order, from the side of the substrate. The substrate is provided thereon with a switch unit connected to the first electrode layer to control electric conduction to the first electrode layer, an operation control unit connected to the switch unit to control the switch unit operation, and a drive control signal conduction element through which a drive control signal passes to drive the operation control unit. The drive control signal conduction element is so aligned as to be at least partly in the non-display region, and in plan view of the substrate, so as to be at least partly superimposed on the barrier region.

In the display device of the type, the recesses spaced from each other with the barriers adjacent thereto are aligned in a matrix pattern to form pixels. In the case where the pixels in the display device are aligned, for example, in such a matrix pattern, all of the pixels are not always in the display region (as real pixels) for display service, and instead a part of them may be in a non-display region (as dummy pixels) not for display service. The reason is due to a matter of device fabrication. For example, in case where the essential display layer is formed in the recess region, it is often difficult to make the layer have a uniform thickness, especially at the periphery of the substrate. In such a case, the recess region in which the thickness of the essential display layer formed may be uneven is made to be a non-display region to thereby cancel the display failure, due to the uneven thickness of the essential display layer. The display failure includes, for example, contract reduction, uneven display, and pixel life reduction.

Naturally, the non-display region does not substantially function for image display in the display device, and the region in the substrate is useless for display. Because of that situation, the present inventors have tried and succeeded in forming the drive control signal conduction element for the operation control unit that controls the operation of the switch unit of the device in at least the non-display region thereof for positive effective utilization of that non-display region. Accordingly, in the display device of the invention, the drive control signal conduction element substantially not in display service like the non-display region is disposed in that non-display region, and this constitution cancels out the area of the substrate not in display service, therefore making it possible to prevent or substantially prevent the display-impossible region of the substrate from increasing.

Further, the display device of the invention is so designed that its drive control signal conduction element is below the barrier region in the direction of the thickness of the substrate, or the barrier region is superimposed on the drive control signal conduction element in the display direction of the device. In plan view of the substrate of this case, the drive control signal conduction element is so aligned as to be at least partly superimposed on the barrier region, and the distance between the second electrode layer and the drive control signal conduction element in the non-display region is relatively enlarged. Specifically, the distance between the second electrode layer and the drive control signal conduction element in the device is kept large, since the drive control signal conduction element is formed below the barrier region of which the thickness is relatively larger than that of the recess region, and, as a result, the capacitance between the second electrode layer and the drive control signal conduction element is kept small as compared with a different case where the drive control signal conduction element is formed below the recess region. For these reasons, the external influence of the capacitance on the drive control signals to pass through the device is reduced. In this constitution, the bottom of each recess in the recess region runs toward the drive control signal conduction element (toward the substrate), and each recess has the second electrode layer around its bottom. Therefore, as compared with the barriers, the recesses in the recess region tend to have an increased capacitance. Contrary to these, however, the barriers in the barrier region protrude farther from the drive control signal conduction element (from the substrate), and each barrier has the second electrode layer around its top. Therefore, as compared with the recesses, the barriers in the barrier region tend to have a reduced capacitance.

Accordingly, the display device of the invention reduces the area of the display-impossible region of its substrate and enlarges the area of the effective display region thereof, and it is free from, or is protected from, errors that may be caused by some external influence on the drive control signal to pass through the device or by some pulse wave deformation or the like in the device. For the display substance to be in the essential display layer of the display device of the invention, for example, organic EL substances can be used. In addition, liquid-crystal substances can also be used.

Preferably, in the display device of the invention, the substrate is provided thereon with a driving voltage conduction element through which the driving voltage passes to drive the operation control unit, an insulating layer is formed between the driving voltage conduction unit and the second electrode layer and between the drive control signal conduction element and the second electrode layer, and the insulating layer region where the drive control signal conduction element is formed is farther from the second electrode than that where the driving voltage conduction element is formed. In this embodiment, a capacitor formed compensates for the current reduction in the driving voltage conduction element, and the capacitor is relatively difficult to form for the drive control signal conduction element. Accordingly, the device of this embodiment receives few external negative influences on the control signal that runs through it. Also preferably, in the display device of the invention, the non-display region may be provided with a first electrode layer between the substrate and the essential display layer and with an insulating layer to block the electric conduction between the first electrode layer and the second electrode layer. In this embodiment, the insulating layer blocks the electric conduction between the electrodes in the non-display region, or makes the electric conduction therebetween in the non-display region more difficult than that in the display region. In fabricating the display device of this embodiment, the electrode layers, the essential display layer and the insulating layer of the device may be formed, for example, through photolithography. In such a case, the insulating layer is formed in the entire recess region, or it is partly opened to have an insulation depleting layer partly therein. In this case, either the display region or the non-display region may be formed in a simplified manner.

Also preferably, in the display device of the invention, the surface of the insulating layer may be formed of a material having an affinity for the essential display layer that is relatively higher than an affinity of the surface of each barrier. This embodiment is almost free from a problem that the thickness of the essential display layer may increase around the barriers, or the essential display layer may be more uniform in this embodiment. As a result, this embodiment will be almost free from a trouble of contrast reduction.

Also preferably in the display device of the invention, the substrate may be provided thereon with multiple scanning lines and multiple data lines formed to cross each other, the switch unit is connected to the scanning lines and the data lines, and the operation control unit includes a data control unit to control the signal to run through the data lines. Apart from this, the switch unit may be connected to the scanning lines and the data lines, and the operation control unit may include a scanning control unit to control the signal to run through the scanning lines. Needless-to-say, the operation control unit may include both the data control unit and the scanning control unit. Also preferably, the substrate may be provided thereon with multiple inspection lines, the switch unit is connected to the inspection lines, and the operation control unit includes an inspection control unit to control the signal to run through the inspection lines. Needless-to-say, the operation control unit may include the data control unit, the scanning control unit and the inspection control unit. In these embodiments, the operation control unit is effective to more surely control the signals to run through the scanning liens and/or the data lines and/or the inspection lines. In such embodiments, these scanning lines and/or data lines and/or inspection lines, and the switch unit are all mounted on the substrate, and therefore effective utilization of the surface area of the substrate for these elements is desired. Because the invention has the specific constitution of the drive control signal conduction element to drive the operation control unit therein, it satisfies the requirement of effective substrate utilization and enables stable supply of drive control signals to the display device.

In the case where an organic EL substance or a liquid-crystal substance is used for the display substance in the display device of the invention, the essential display layer of the display substance of such a light-emitting substance or a liquid-crystal substance may be formed for the respective pixels (in the recess region) in an inkjet process. In such an inkjet process, the non-display region may be formed in a predetermined region, for example, at the periphery of the substrate surface to prevent or substantially prevent the thickness of the essential display layer from being uneven. Accordingly, in case where the essential display layer is formed in such an inkjet process, the constitution of the invention enables effective utilization of the non-display region of the surface of the substrate.

The electronic apparatus of the invention is equipped with the above display device as above for the display element thereof. Exemplary electronic apparatus include, for example, mobile phones, wristwatches and various information processors such as word processors and personal computers. Most of such electronic apparatus are small sized, and the display device of the invention packaged in them enables effective utilization of their display region. Even though the electronic apparatus are small-sized as a whole, the invention ensures a relatively large display region.

DETAILED DESCRIPTION OF PREFERRED EMBODIMENTS

Figure 1:
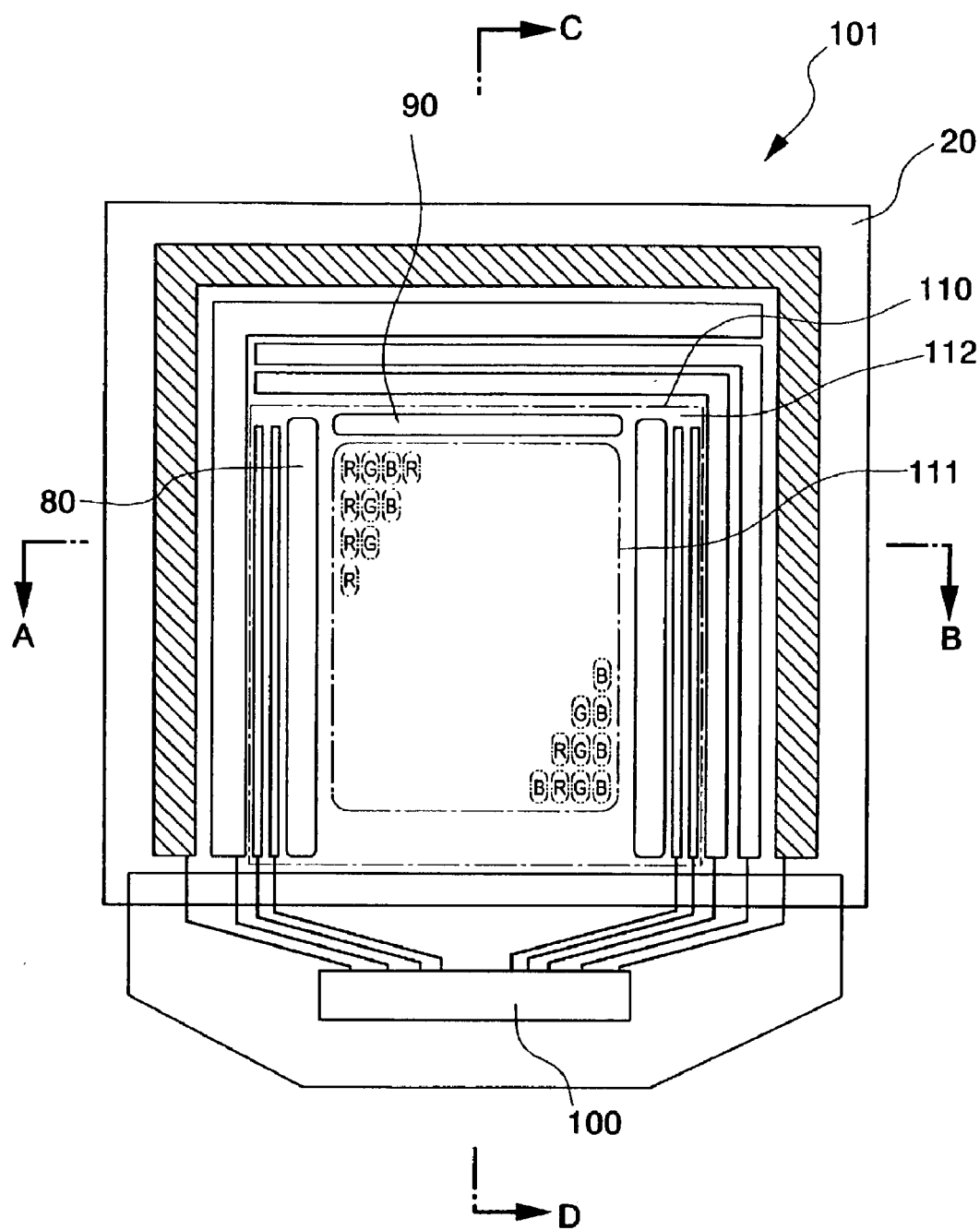
FIG. 1 is a schematic plan view of an EL display device, in accordance with an exemplary embodiment of the display device of the invention.

Exemplary embodiments of the invention are described hereinunder with reference to the drawings attached hereto. The exemplary embodiments demonstrate some preferred embodiments of the invention and do not whatsoever restrict the invention. The exemplary embodiments may be modified in any desired manner within the technical scope of the invention. In the drawings referred to hereinunder, the layers and the members that constitute the illustrated devices are scaled down differently from their actual scale in order to be well recognizable in the drawings.

Figure 2:
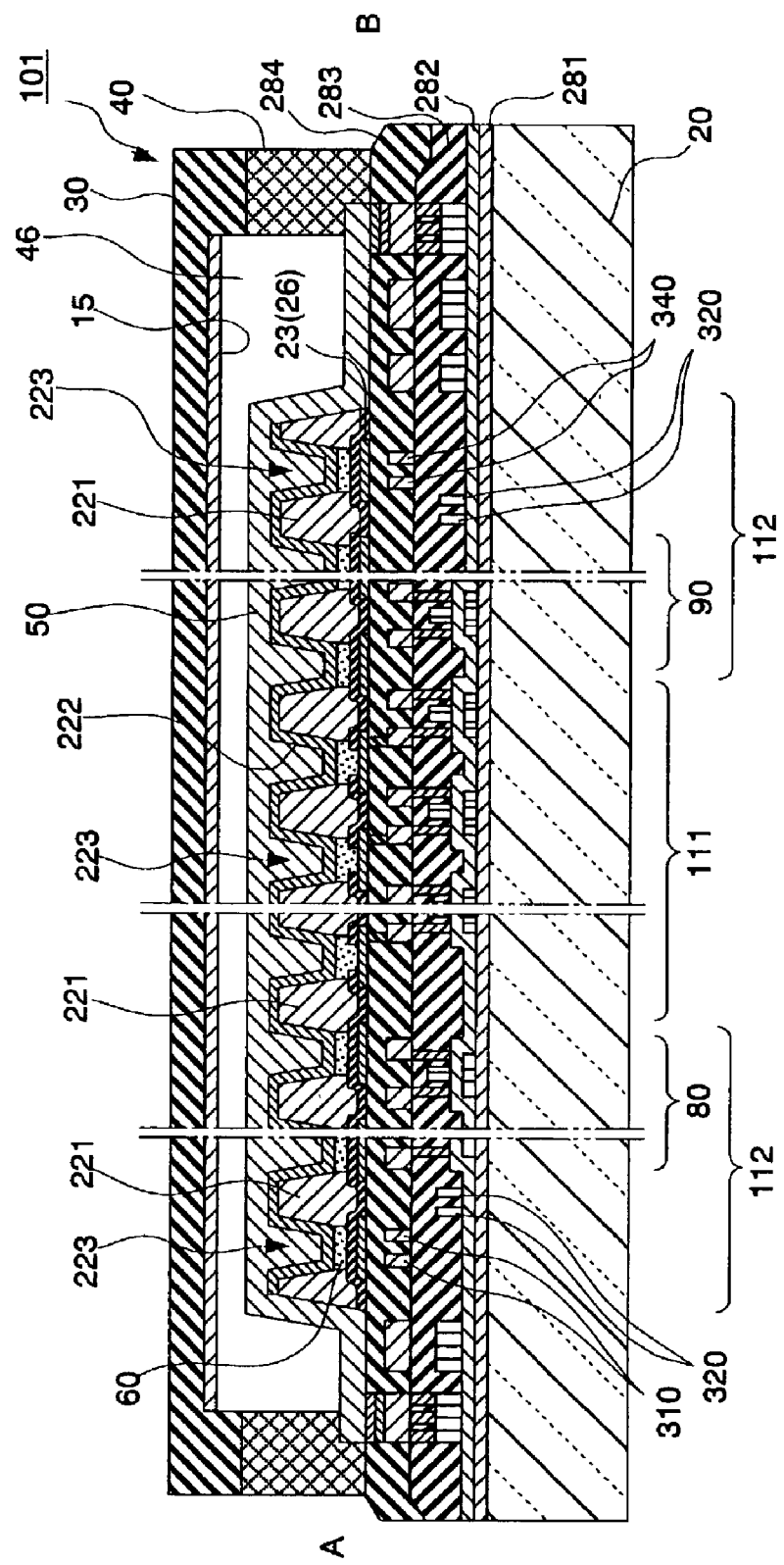
FIG. 2 is a schematic cross-sectional view taken along plane A-B of FIG. 1.

An embodiment of the invention that is applied to an EL display in which the electro-optical substance to form the essential display layer is an electroluminescent (EL) substance is described first. FIG. 1 and FIG. 2 are a plan view and a cross-sectional view taken along plane A-B, respectively, and schematically show the constitution of the EL display device of this embodiment. The EL display device 101 shown in FIGS. 1 and 2 is an EL display device for an active matrix system, in which a thin film transistor (TFT) is used for the switch unit.

In addition to the switch unit, TFT (which can be used to refer to TFT 24 in FIG. 3, and to a pixel TFT) to control as to whether or not a data signal is written in the pixel electrode 23 (see FIG. 2) therein, the EL display device 101 has, on the substrate 20, other switch unit driving TFT (which may be referred to as a driving circuit TFT) for the scanning line-driving circuit 80 and the inspection circuit 90. The pixel region 110 of the display device 101 includes a real pixel region 111 for panel display and a dummy region 112 not for display, in which the dummy region 112 is formed in the area except the real pixel region 111.

As in FIG. 2, the EL display device 101 is so designed that the active matrix substrate 20 is stuck to the opposite seal substrate (opposite substrate) 30 with a sealant resin 40 therebetween, a desiccant 15 is in the region surrounded by the two substrates 20, 30 and the sealant resin 40, and the space between the two substrates 20, 30 is filled with $N_2$ gas to form an $N_2$ gas layer 46. A cathode 222 via an anode (pixel electrode) 23, a hole injection/transport layer 70 (see FIG. 3) capable of injecting/transporting holes from the anode (pixel electrode) 23 and a layer 60 of an organic EL substance, a type of electro optical substance (hereinafter a light-emitting layer or an organic EL layer), for example, in a mode of vapor deposition or the like, are formed on the active matrix substrate 20. A light-transmitting insulating plate of, for example, glass, quartz or plastics, can be used for the active matrix substrate 20 and the seal substrate (opposite substrate) 30.

The scanning line-driving circuit 80 to drive the pixel TFT 24 (see FIG. 3) is mounted on the active matrix substrate 20. On the other hand, a data line-driving circuit 100 is attached thereto, as a data driver IC mounted on a different substrate. Needless-to-say, the data line-driving circuit 100 may be mounted on the active matrix substrate 20.

The inspection circuit 90 monitors the operation, of the display device 101, and this is equipped with, for example, an information output unit to output the monitored result to an outer device connected to the device 101.

Figure 3:
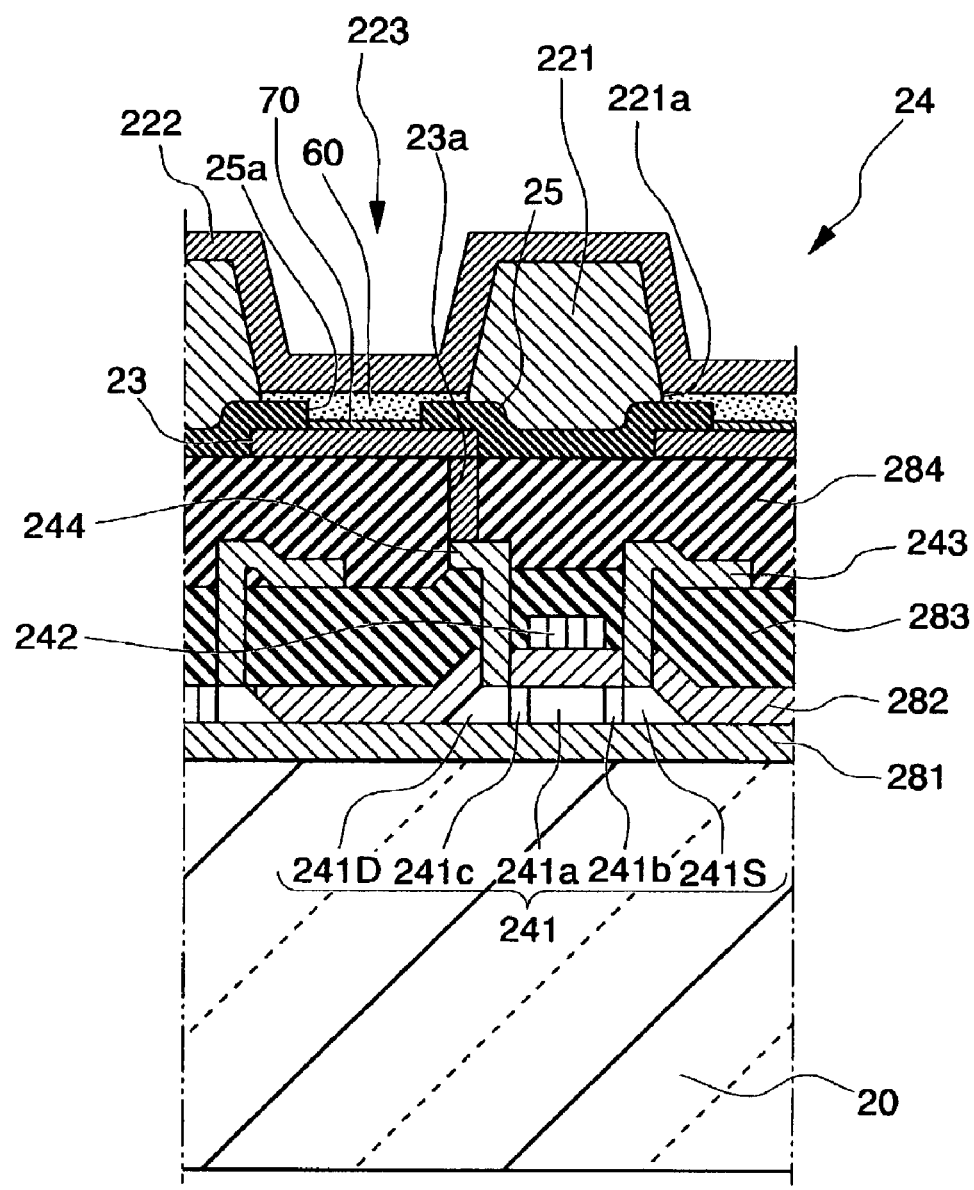
FIG. 3 is an enlarged schematic cross-sectional view showing a significant part of FIG. 2.

The scanning line-driving circuit 80 and the data line-driving circuit 100 are formed to be a scanning control unit and a data control unit, respectively, to control the signal output to the scanning lines and the data lines in the device 101, in which the scanning lines and the data lines are connected to the pixel TFT 24 (see FIG. 3). Accordingly, based on the operation control signal from the scanning line-driving circuit 80 and the data line-driving circuit 100, the pixel TFT 24 (see FIG. 3) operates to electrically control the pixel electrode 23.

Figure 4:
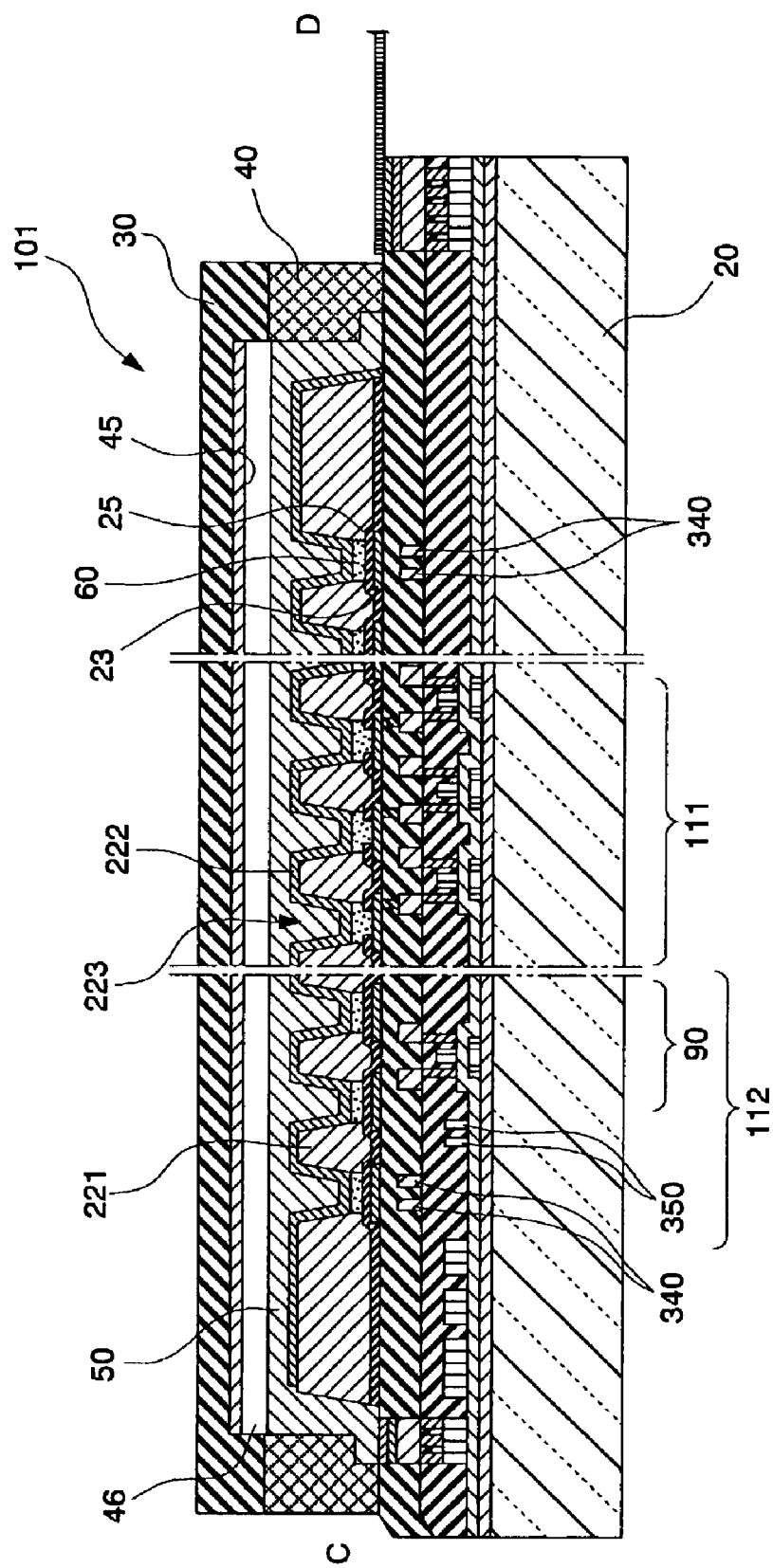
FIG. 4 is a schematic cross-sectional view taken along plane C-D of FIG. 1.
Figure 5:
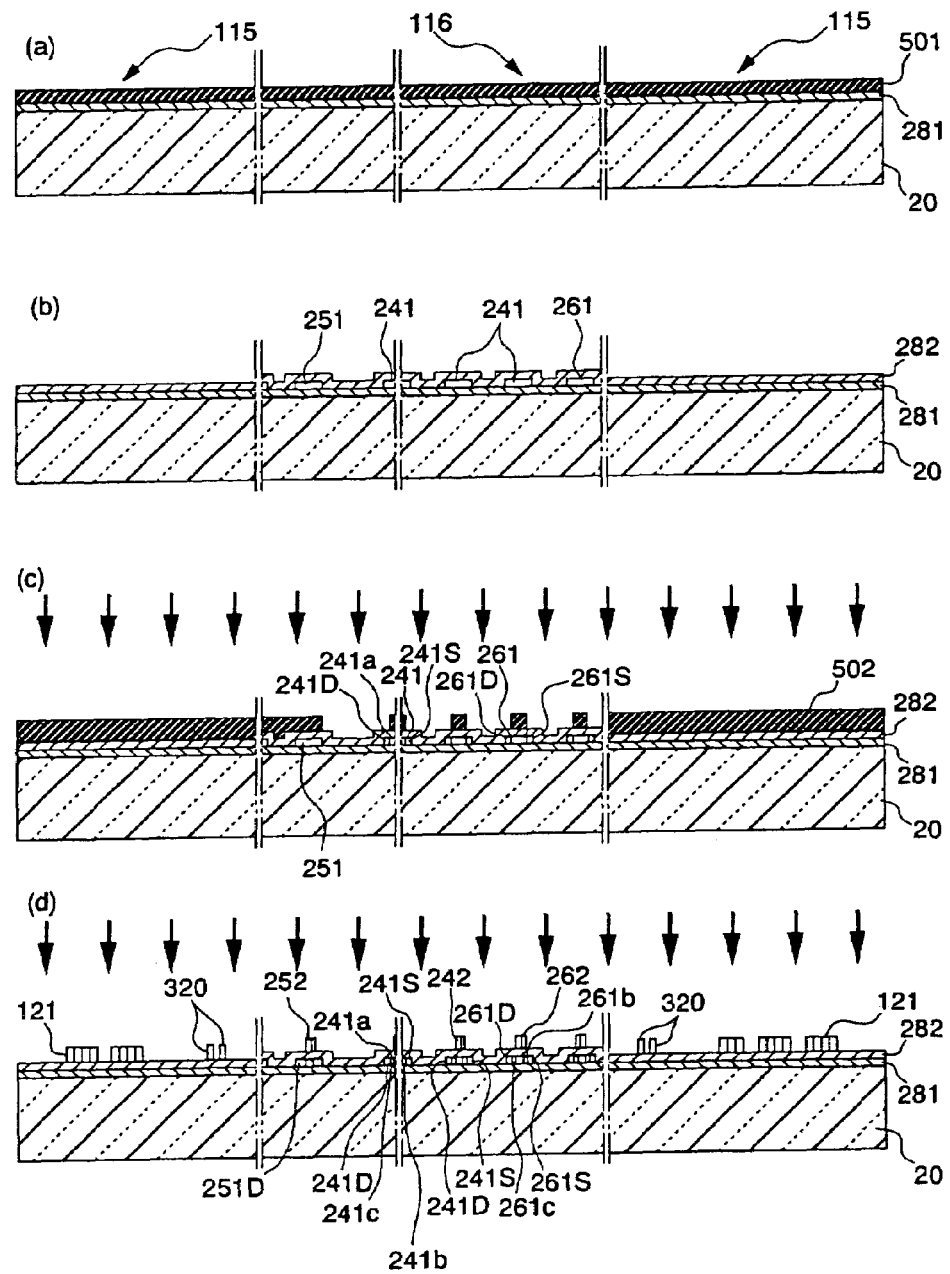
FIGS. 5(a)–5(d) are schematics showing one example of the fabrication process for the EL display device of FIG. 1.
Figure 6:
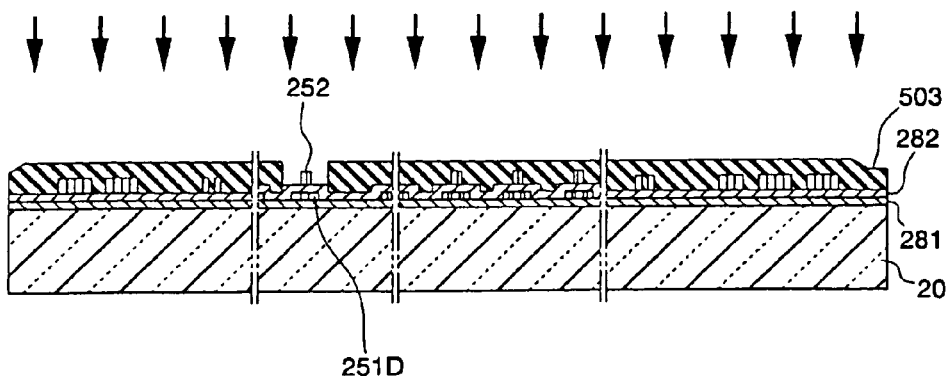
FIGS. 6(e)–6(g) are schematics showing the fabrication process for the EL display device, subsequently to FIGS. 5(a)–5(d)
Figure 6:
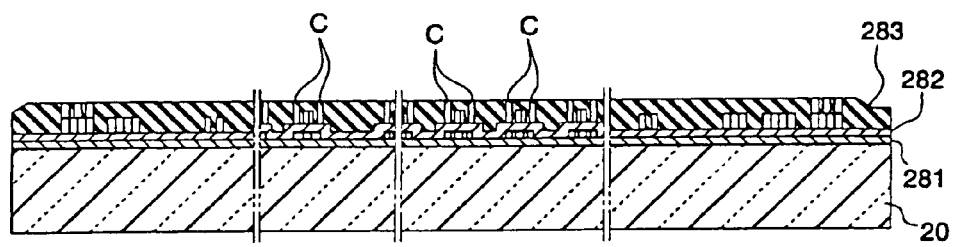
Figure 6:
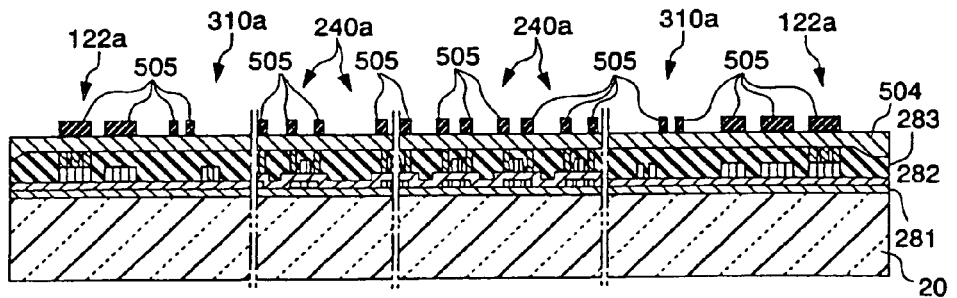
Figure 7:
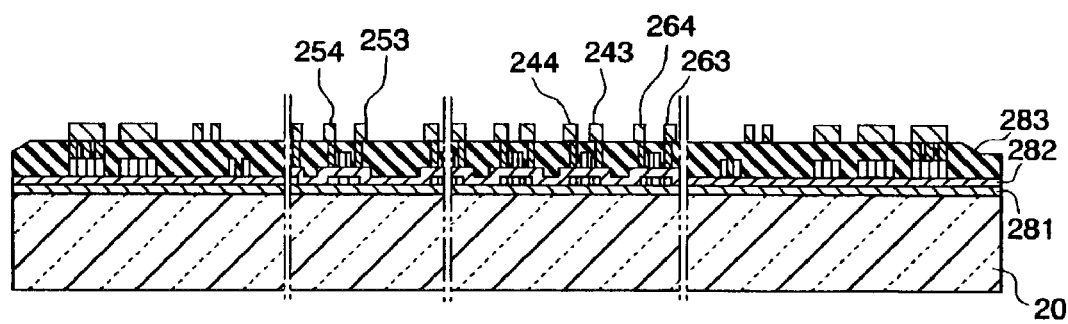
FIGS. 7(h)–7(j) are schematics showing the fabrication process for the EL display device, subsequently to FIGS. 6(e)–6(g)
Figure 7:
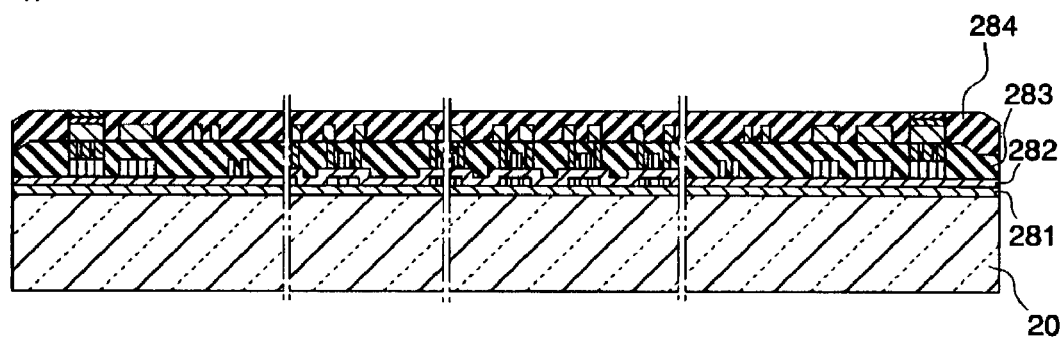
Figure 7:
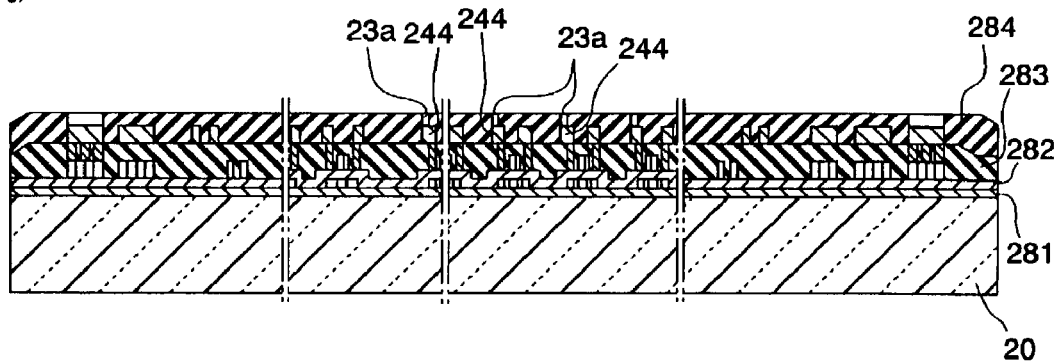

The scanning line-driving circuit 80 and the data line-driving circuit 100 receive driving current from a predetermined power source via a driving voltage conduction element 310 (see FIG. 2) and a driving voltage conduction element 340 (see FIG. 4). The scanning line-driving circuit 80 and the data line-driving circuit 100 receive drive control signals from a predetermined main driver or the like that controls the operation of the display device 101, via a drive control signal conduction element 320 (see FIG. 2) and a drive control signal conduction element 350 (see FIG. 4). The drive control signals from the main driver or the like are those to control the scanning line-driving circuit 80 and the data line-driving circuit 100 that output their signals, for example, to control the timing of the signal output from them to the scanning lines and the data lines.

FIG. 3 is a cross-sectional view showing the constitution of the TFT (pixel TFT) 24 and thereabout aligned in accordance with the real pixel region 111 of the display region in the display device. As illustrated therein, the surface of the active matrix substrate 20 is coated with an under layer-protecting layer 281 of essentially $SiO_2$, on which is formed a silicon layer 241. The surface of the silicon layer 241 is covered with a gage insulating layer 282 of essentially $SiO_2$, and/or SiN. Of the silicon layer 241, the area that overlaps with a gate electrode 242 via the gate-insulating layer 282 therebetween is a channel region 241a. The gate electrode 242 is a part of the scanning lines in the device. On the other hand, the surface of the gate-insulating layer 282, which covers the silicon layer 241 and on which is formed the gate electrode 242, is coated with a first insulating interlayer 283 of essentially $SiO_2$. In this description, "essential" indicates the component that is provided in such a quantity so as to constitute the highest content in the element.

Of the silicon layer 241, the channel region 241a on the source side is adjacent to a low-concentration source region 241b and a high-concentration source region 241s, while the channel region 241a on the drain side is to a low-concentration drain region 241c and a high-concentration drain region 241D. Having these adjacent thereto, the channel region 241a forms an LDD (light-doped drain) structure. Of these, the high-concentration source region 241S is connected to a source electrode; 243 via a contact hole that runs through the gate-insulating layer 282 and the first insulating interlayer 283. The source electrode 243 forms a part of the data lines (that extend in the direction perpendicular to FIG. 3). On the other hand, the high-concentration drain region 241D is connected to a drain electrode 244 via a contact hole that runs through the gate-insulating layer 282 and the first insulating interlayer 283. The source electrode 243 and the drain electrode 244 are made of the same material.

The first insulating interlayer 283, in which are formed the source electrode 243 and the drain electrode 244, is covered with a second insulating interlayer 284 of essentially a resin component, such as an acrylic resin. Apart from such an acrylic resin, the second insulating interlayer 284 may also be formed of SiN or $SiO_2$, for example.

A pixel electrode 23 of ITO is formed on the surface of the second insulating interlayer 284, and it is connected to the drain electrode 244 via a contact hole 23a that runs through the second insulating interlayer 284. Accordingly, the pixel electrode 23 is connected to the high-concentration drain electrode 241D of the silicon layer 241, via the drain electrode 244.

TFT (driving circuit TFT) in the scanning line-driving circuit 80 and the inspection circuit 90, for example, the N-channel type or P-channel type TFT in these driving circuits to constitute the inverter in a shift register has the same constitution as that of the TFT 24, except that it is not connected to the pixel electrode 23.

The surface of the second insulating interlayer 284, on which is formed the pixel electrode 23, is coated with a hydrophilic control layer 25 of, for example, essentially $SiO_2$, and further with an organic bank layer 221 of, for example, an acrylic or polyimide resin. A hole injection/transport layer 70 and an organic EL layer 60 are layered in that order on the pixel electrode 23 in the area inside the opening 25a formed through the hydrophilic control layer 25 and inside the opening 221a formed adjacent to the organic bank layer 221.

The hole injection/transport layer 70 and the organic EL layer 60 are covered with a cathode 50 formed by laminating Ca 222, Al, for example. Having the basic constitution as above, the EL display device 101 is sealed up with the seal substrate 30 and contains the desiccant 15 therein, and its life is thereby prolonged, as shown in FIG. 2.

As shown in FIG. 2, in the display device 101 of this embodiment illustrated, the driving voltage conduction element 310 on the side of the scanning lines is formed in the dummy region 112, specifically below the recesses in the recess region 223 that are spaced from each other with the organic bank layers 221 adjacent thereto. Accordingly, the driving voltage conduction element 310 on the side of the scanning lines is aligned at a location not below the organic bank layers 221. In the plan view of the display device 101 or the substrate 20, the driving voltage conduction element 310 is so aligned as to at least overlap with the recesses in the recess region 223 of the dummy region 112.

In this constitution, the dummy region 112 is a non display region not for display, and the non display region is made to overlap with the driving voltage conduction element 310 having no substantial display function. Specifically, as in FIG. 2, these elements are superimposed on each other in the direction of display service of the device. Having this specific constitution, the display device of this embodiment ensures effective utilization of the non display pixel region.

The cathode 50, the layer 222, the hydrophilic control layer 25, the insulating layer 284 and the power source line (driving voltage conduction element) 310 are formed in the recess region 223, in that order from the top, and the distance between the power source line and the cathode is thereby narrowed, as compared with a different case where these elements are formed in the barrier region. Accordingly, the capacitance between the power source line and the cathode can be kept large in this constitution, in which, therefore, ever when the voltage in the power source line is lowered, the capacitance can compensate for the power reduction. The advantage thereof is that the display device having this constitution is free from, or is protected from, operation failure, such as errors that may be caused by driving voltage reduction.

The drive control signal conduction element on the side of the scanning lines (circuit control signal lines) 320 is formed in the dummy pixel region 112, specifically below the organic bank layer 221. Specifically, the drive control signal conduction element on the side of scanning lines 320 is formed in accordance with the organic bank layer 221, and in the plan view of the display device 101 or the substrate 20, the element 320 is so aligned as to at least overlap with the organic bank layer 221 in the dummy pixel region 112.

In this constitution, the dummy region 112 is a non display pixel region not for display, and the non display pixel region is made to overlap with the drive control signal conduction element 320 having no substantial display function, in the direction of display service of the device. Having this specific constitution, the display device of this embodiment ensures effective utilization of the non display pixel region. In addition, since the drive control signal conduction element 320 is formed below the organic bank layer 221 to overlap with it in the plan view of the device, the distance between the drive control signal conduction element 320 and the cathode 222 is relatively enlarged, as compared with a different case where the drive control signal conduction element 320 is formed below the recess region 223. Thus, a capacitor of high capacitance is hardly formed in the distance between these elements, and therefore the influence of the cathode on the signal that passes through the drive control signal conduction element 320 is reduced. In this connection, if a capacitor of high capacitance is formed between the element 320 and the cathode, it will cause some problems, in that the wave of the pulse signal that passes through the drive control signal conduction element 320 may be unsharpened. In this embodiment, however, the drive control signal conduction element 50 is disposed in the site that hardly has a high capacitance, and is therefore free from, or is protected from, such failure.

FIG. 4 is a cross-sectional view taken along plane C-D of FIG. 1. As illustrated therein, the driving voltage conduction element 340 on the side of the inspection circuit, which is to drive the inspection circuit 90, is in the dummy region 112, and specifically below the recesses in the region 223 that are spaced from each other with the organic bank layers 221 adjacent thereto, or it is superimposed on the recess region 223 in the plan view of the device. In addition, the drive control signal conduction element 350 on the side of the data lines is also in the dummy region 112, and specifically below the organic bank layer 221, or it is superimposed on the organic bank layer 221 in the plan view of the device. Accordingly, like that of the driving voltage conduction element 310 and the drive control signal conduction element 320 on the side of the scanning lines mentioned above, this constitution enables effective utilization of the dummy region 112 with no substantial display function, and enables stable supply o; driving current to the inspection circuit 90 and stable transmittance of data signals thereto. In the case where the data line-driving circuit 100 is formed on the same substrate 20, the driving voltage conduction element and the drive control signal conduction, element for it may also be formed below the recess region 223 and the organic bank layer 221, respectively, in the dummy region 112 like in the above structure, and this constitution enjoys the same advantages as above.

One example of the process for fabricating the display device 101 of this embodiment is described below.

FIGS. 5(a)–8(m) show an exemplary process for fabricating the display device 101, especially the process of mounting the constitutive components or the active matrix substrate 20. The cross-sectional views of FIGS. 5(a)–8(m) correspond to the cross-sectional view taken along plane A-B of FIG. 1 having the scanning line-driving circuit 80 formed therein, especially to the cross-section 115 of the area in which the dummy region 112 is to be formed (see FIG. 5(a)) and to the cross-section 116 of the area in which the real pixel 111 (TFT 24) is to be formed (see FIG. 5(a)). In the following description, the impurity concentration is in terms of the concentration of the impurity having been annealed for activation.

As shown in FIG. 5(a), an under layer-protecting layer 281 of a silicon oxide film or the like is formed on the surface of the active matrix substrate 20 which is an insulating substrate of quartz, glass or the like.

Next, an amorphous silicon layer 501 is formed thereon through ICVD or plasma CVD, and the crystal grains therein are grown through laser annealing or rapid heating to provide a polysilicon layer.

Next, as shown in FIG. 5(b), the polysilicon layer is patterned through photolithography to form island silicon layers 241, 251 and 261. Of these layers, the silicon layer 241 is in the display region and forms a TFT (pixel TFT) 24 to be connected to a pixel electrode 23; and the silicon layers 251 and 261 form P-channel type and N-channel type TFTs (driving circuit TFTs), respectively, to be in the scanning line-driving circuit 80.

Next, a gate-insulating layer 282 of a silicon oxide film having a thickness of approximately from 30 nm to 200 nm is formed on the overall surface of the silicon layer through plasma CVD or thermal oxidation, as shown in FIG. 5(b). In case where the gate-insulating layer 282 is formed through thermal oxidation, the silicon layers 241, 251 and 261 are crystallized at the same time, and these silicon layers may be polysilicon layers. For channel doping, for example, boron ions of a dose of about $1 \times 10^{12}$ cm$^{-2}$ are implanted at that timing. As a result, the silicon layers 241, 251 and 261 become low-concentration P-type silicon layers having an impurity concentration of about $1 \times 10^{17}$ cm$^{-3}$.

Next, a mask for selective ion implantation is formed on a part of the channel layers of P-channel type TFT and the N-channel type TFT, and in that condition, phosphorus ions of a dose of about $1 \times 10^{15}$ cm$-2$ are implanted thereto. As a result, the high-concentration impurity is introduced into the necessary part of the layers in a self-aligned manner relative to the patterning mask, thereby forming high-concentration source regions 241S and 261S and high-concentration drain regions 241D and 261D in each of the silicon layers 241 and 261, as shown in FIG. 5(c).

Next, a gate electrode forming conductive layer 502 of a doped silicon or silicide film or a metal film of aluminium, chromium or tantalum, is formed on the overall surface of the gate-insulating layer 282, as in FIG. 5(c). The thickness of the conductive layer 502 is approximately 500 nm or so.

Next, this layer is patterned to form a gate electrode 252 to provide the P-channel type driving circuit TFT, a gate electrode 242 to give the pixel TFT, and a gate electrode 262 to provide the N-channel type driving circuit TFT, as shown in FIG. 5(d). In this step, the drive control signal conduction element 320 (350) and the first layer 121 of the cathode power source line are also formed at the same time. In this case, the drive control signal conduction element 320 (350) is formed in the dummy region 112.

Next, phosphorus ions of a dose of about 4×1013 cm' are implanted into the silicon layers 241, 251 and 261, via the gate electrodes 242, 252 and 262 that serve as a mask, as shown in FIG. 5(d). As a result, the low concentration impurity is implanted into these silicon layers in a self aligned manner relative to the gate electrodes 242, 252 and 262, to thereby form low-concentration source regions 241b and 261b and low-concentration drain regions 241c and 261c in the silicon layers 241 and 261, as shown in FIGS. 5(c) and 5(d). In addition, low-concentration impurity regions 251s and 251D are also formed in the silicon layer 251.

Next, a mask 503 for selective ion implantation is formed to cover the area except the P-channel type driving circuit TFT 252, as shown in FIG. 6(e). Via the mask 503 for selective ion implantation, boron ions of a dose of about 1.5×10'5 cm are implanted into the silicon layer 251. In this step, the gate electrode 252 to form the P-channel type driving circuit TFT also serves as a mask, and the high-concentration impurity is doped into the silicon layer 252 in a self-aligned manner. Accordingly, the parts 251s and 251D of the layer 251 are counter doped to be a source region and a drain region for the P-channel type driving circuit TFT.

Next, a first insulating interlayer 283 is formed on the overall surface of the active matrix substrate 20, and this element is patterned through photolithography to form contact holes C in the site corresponding to the source electrode and the drain electrode of each TFT, as shown in FIG. 6(f).

Next, a conductive layer 504 of a metal, such as aluminium, chromium or tantalum, is formed to cover the first insulating interlayer 283, as shown in FIG. 6(g). The thickness of the conductive layer 504 is approximately from 200 nm to 800 nm or so. After this, a patterning mask 505 is formed to cover the region 240a of the conductive layer 504 which is to form the source electrode and the drain electrode of each TFT, the region 310a thereof which is to form the driving voltage conduction element 310 (340), and the region 122a thereof which is to form the second layer of the cathode power source line, and in that condition, the conductive layer 504 is patterned via the mask 505 to thereby form the source electrodes 243, 253 and 263 and the drain electrodes 244, 254 and 264, as shown in FIG. 7(h).

Next, a second insulating interlayer 284 is formed of a resin material, such as an acrylic resin, to cover the first insulating interlayer 283 having those electrodes formed thereon, as shown in FIG. 7(i). Preferably, the second insulating interlayer 284 is formed to have a thickness of approximately from 1 to 2 μm or so. If desired, the second insulating interlayer may be formed of SiN or $SiO_2$. Preferably, the thickness of the SiN layer is 200 nm, and the thickness of the SiO2 layer is 800 nm.

Next, the part of the second insulating interlayer 284 that corresponds to the drain electrode 244 for pixel TFT is etched away to form a contact hole 23a, as shown in FIG. 7(j).

After this, a thin film of a transparent electrode material, such as ITO, is formed to cover the overall surface of the active matrix substrate 20. Then, the thin film is patterned to form a pixel electrode 23 that communicates with the drain electrode 244 via the contact hole 23a of the second insulating interlayer 284, and at the same time, a dummy pattern 26 for the dummy region is also formed, as shown in FIG. 8(k). (In FIG. 2, the pixel electrode 23 generically includes those pixel electrode 23 and dummy pattern 26.) The dummy pattern 26 is so designed that it is not connected to the underlying metal line via the second insulating interlayer 284. Specifically, the dummy pattern 26 is formed as islands, and its shape is almost the same as that of the pattern of the pixel electrode 23 formed in the display region. Needless-to-say, the shape of the dummy pattern 26 may differ from that of the pattern of the pixel electrode 23 formed in the display region. In this case, the dummy pattern 26 shall include at least the components positioned above the driving voltage conduction element 310 (340).

Next, an insulating layer of a hydrophilic control layer 25 is formed on the pixel electrode 23, the dummy pattern 26 and the second insulating interlayer, as shown in FIG. 8(l). On the pixel electrode 23, the insulating layer (hydrophilic control layer) 25 is so designed that it is partly open, and the opening 25a of the layer 25 (in this connection, see also FIG. 3) enables hole transfer from the pixel electrode 23 through it. Contrary to this, in the dummy pattern 26 not having such an opening 25a, the insulating layer (hydrophilic control layer) 25 acts as a hole transfer blocking layer, and no hole passes through it.

Next, an organic bank layer 221 is formed to cover a predetermined part of the insulating layer (hydrophilic control layer) 25. One specific method of forming the organic bank layer includes dissolving a resist, such as acrylic resin or polyimide resin, in a solvent and applying the resulting solution to the layer 25 in a mode of, for example, spin coating or dippings to form the intended organic layer. The material to form the organic layer may be any and every one that does not dissolve in the solvent of ink mentioned below and capable of being readily etched to form the intended pattern. Next, the organic layer is etched through photolithography or the like to form the openings 221a for banks, and the organic bank layer (barrier) 221 surrounded by a wall surface is formed in every opening 221a. Also in this case, the organic bank layer 221 shall include at least the components positioned above the drive control signal conduction element 320 (350).

Next, an ink-philic region and an ink-repellent region are formed in the surface of the organic bank layer 221. In this embodiment, the two regions are formed through plasma treatment. Specifically, the plasma treatment includes a pre-heating step, a step of ink-philication to make the top face of the bank 221, the side wall face of the opening 221a, the electrode face 23c of the pixel electrode 23 (that is, the face of the pixel electrode) and the top face of the insulating layer (hydrophilic control layer) 25 ink-philic, a step of ink-repellency treatment to make the top face of the organic bank layer and the side wall face of the opening ink-repellent, and a cooling step.

More specifically, the substrate (substrate 20 having the bank and other components formed thereon) is heated at a predetermined temperature (e.g., at 70 to 80° C. or so), then it is subjected to plasma treatment in air in which oxygen serves as a reaction gas (O2 plasma treatment). The latter step is the step for ink-philication. Next, it is subjected to plasma treatment in air, using tetra fluoromethane as a reaction gas (CF4 plasma treatment). This is the step for ink repellency treatment. Finally, the substrate having been heated through the plasma treatment is cooled. Thus processed, the substrate becomes partly ink-philic and ink repellent in predetermined different sites thereof. The CF9 plasma treatment will have some influence on the electrode face 23c of the pixel electrode 23 and on the insulating layer (hydrophilic control layer) 25. However, since the material of the pixel electrode 23, ITO (indium tin oxide), and the constitutive material of the insulating layer (hydrophilic control layer) 25, SiO, or TiO, both have a low affinity for fluorine, the hydroxyl group given to them in the previous step of ink philication is not substituted with a fluorine group through the CF., plasma treatment, and therefore the pixel electrode 23 and the insulating layer 25 still remain ink-philic, even after the treatment.

Next, it is processed to form a hole injection/transport layer 70 in the next step of forming the hole injection/transport layer, as shown in FIG. 8(l) (in this connection, see also FIG. 3). In the hole injection/transport layer forming step, an ink composition that contains a hole injection/transport layer material is jetted out onto the electrode surface 23c in an inkjet process, and then it is dried and heated to form the hole injection/transport layer 70 on the electrode 23. In and after this hole injection/transport layer forming step, it is desirable that the substrate, with the components formed thereon, is processed in an inert gas atmosphere of, for example, nitrogen or argon to prevent the hole injection/transport layer 70 and the light-emitting layer (organic EL layer) 60 formed thereon, from being oxidized. For example, an ink composition that contains a hole injection/transport layer material is filled into an inkjet head (not shown), the jet nozzle of the inkjet head is directed toward the electrode face 23c in the opening 25a formed in the insulating layer (hydrophilic control layer) 25, and in that condition, ink drops are jetted out onto the electrode face 23c through the jet nozzle while the inkjet head and the substrate (substrate 20) are relatively moved. In this step, the amount of one ink drop to be jetted out through the jet nozzle is predetermined. Next, the thus jetted out ink drops are dried to remove the polar solvent from the ink composition to thereby form the intended hole injection/transport layer 70 (see FIG. 8(l) and FIG. 3).

The ink composition may be prepared by dissolving a mixture of a polythiophene derivative, such as polyoxyethylene-dioxythiophene and polystyrenesulfonic acid, or the like, in a polar solvent, such as isopropyl alcohol. The ink drops thus jetted out onto the ink-philicated electrode surface 23c spread thereon to fill the opening 25a of the insulating layer (hydrophilic control layer) 25. On the other hand, the top face of the organic bank layer 221, having been subjected to the ink-repellency treatment, repels the ink drops and does not receive them. Accordingly, even if the ink drops are jetted out onto the top face of the organic bank layer 221, occasionally shifted from the predetermined site onto which they are to be jetted out, the top face of the layer 221 is not wetted with the ink drops and the ink drops repelled by it shall move into the opening 25a of the insulating layer (hydrophilic control layer) 25.

Next, a light-emitting layer (organic EL layer) 60 (for this, also refer to FIG. 3) is formed on this structure in the next step of forming the light-emitting layer, as shown in FIG. 8(l). In the step of forming the light-emitting layer, an ink composition that contains a light-emitting layer material is jetted out onto the hole injection/transfer layer 70 like in the above mentioned inkjet process, and then this structure is dried and heated to form the intended light-emitting layer 60 in the opening 221a formed in the organic bank layer 221.

In the step of forming the light-emitting layer, the solvent for the ink composition to provide the light-emitting layer is a non-polar solvent that does not dissolve the hole injection/ transport layer 70, to prevent the layer 70 from being re-dissolved in the composition. On the other hand, however, the hole injection/transport layer 70 is poorly wettable with such a non polar solvent, and therefore, even though the ink composition that contains such a non-polar solvent is jetted out onto the hole injection/transport layer 70, the layer 70 may repel the ink composition for the light-emitting layer, and as a result, the light-emitting layer 60 formed could not firmly adhere to the underlying hole injection/transport layer 70. In addition., the light-emitting layer 60 could not be uniformly formed on the layer 70. Therefore, to increase the wettability of the surface of the hole injection/transport layer 70 with a non polar solvent, the layer 70 is preferably subjected to surface modification. before the light-emitting layer is formed thereon. The surface modification may be attained, for example, by applying a solvent that is the same as, or similar to, the non polar solvent onto the hole injection/transfer layer 70 in a mode of inkjetting, spin coating, dipping or the like, followed by drying the thus coated surface of the layer 70. The solvent for such surface modification includes, for example, cyclohexylbenzene, dihydrobenzofuran, trimethylbenzene and tetramethylbenzene, that fall in the scope of the non polar solvent to be in the ink composition, and toluene and xylene that fall in the scope of a solvent similar to the non polar solvent.

The surface modification step is then followed by the next step of forming the light-emitting layer in a mode of inkjetting, like in the previous step. Specifically, for example, an ink composition that contains a material for a blue (B) emitting layer is filled into an inkjet head (not shown), then the jet nozzle of the inkjet head is directed toward the hole injection/transport layer 70 in the opening 25a of the insulating layer (hydrophilic control layer) 25, and in that condition, ink drops are jetted out onto the hole injection/transport layer 70 through the jet nozzle while the inkjet head and the substrate are relatively moved. In this step, the amount of one ink drop to be jetted out through the jet nozzle is predetermined.

The light-emitting material to form the light-emitting layer 60 includes, for example, fluorenone based polymer derivatives, (poly)paraphenylene-vinylene derivatives, polyphenylene derivatives, polyfluorene derivatives, polyvinylcarbazoles, polythiophene derivatives, perylene dyes, coumarin dyes, rhodamine dyes, as well as low molecular organic EL materials and high molecular organic EL materials soluble in benzene derivatives. Specifically, rubrene, perylene, 9, 10-diphenylanthracene, tetraphenylbutadiene, Nail Red, Coumarin 6, quinacridone and others are employable herein. On the other hand, the non-polar solvent for the ink composition is preferably one that does not dissolve the hole injection/transport layer 70. For example, it includes cyclohexylbenzene, dihydrobenzofuran, trimethylbenzene and tetramethylbenzene.

Thus jetted out thereonto, the ink drops spread on the hole injection/transport layer 70 to fill the opening 25a of the hydrophilic control layer 25. On the other hand, the top face of the organic bank layer 221, having been subjected to the ink-repellency treatment, repels the ink drops and does not receive them. Accordingly, even if the ink drops are jetted out onto the top face of the organic bank layer 221, occasionally shifted from the predetermined site onto which they are to be jetted out, the top face of the layer 221 is not wetted with the ink drops and the ink drops repelled by it shall move into the opening 25a of the hydrophilic control layer 25 and into the opening 221a of the organic bank layer 221. Next, the ink drops, thus having been jetted out to be in these openings, are dried to remove the non polar solvent from the ink composition to thereby form the intended blue emitting layer (light-emitting layer 60).

Like the blue emitting layer, for example, a red-emitting layer (light-emitting layer 60) is then formed, and a green-emitting layer (light-emitting layer 60) is finally formed. Regarding the order of forming the light-emitting layers 60 of different colors, it is desirable that the layers for which the number of the constitutive components of the material is smaller are formed earlier than the others for which the number of the constitutive components of the material is larger. If not, or if the light-emitting layers for which the number of the constitutive components of the material is larger are formed earlier than the others for which the number of the constitutive components of the material is smaller, it is undesirable since the solvent vapor from the ink compositions of the light-emitting layers of different colors formed later will re-dissolve the light-emitting layers having been formed earlier to cause component separation in the thus-formed layers.

The hole injection/transport layer and the light-emitting layer are formed according to such an inkjet process, in which the tilt angle of the inkjet head to be used shall be controlled in accordance with the pitch of the light-emitting dots. This is because the nozzle pitch of the inkjet head does not always correspond to the pitch of the light-emitting dots to be formed, and therefore he head is appropriately tilted so that it may well correspond to the pitch of the light-emitting dots to be formed.

Figure 8:
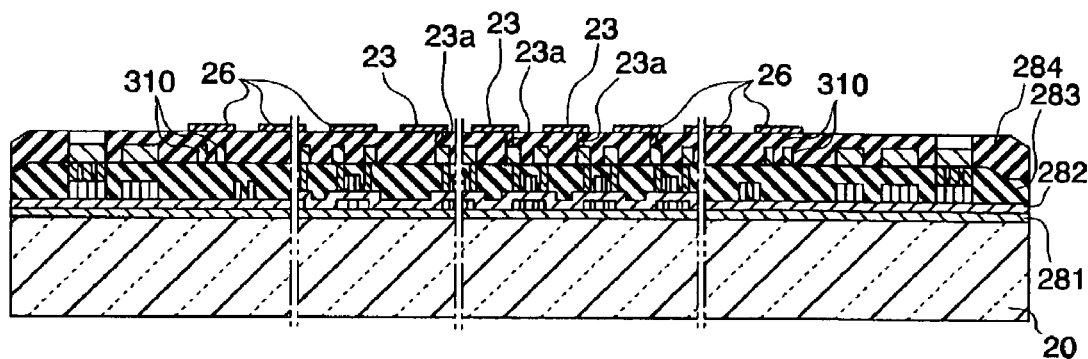
FIGS. 8(k)–8(m) are schematics showing the fabrication process for the EL display device, subsequently to FIGS. 7(h)–7(j)
Figure 8:
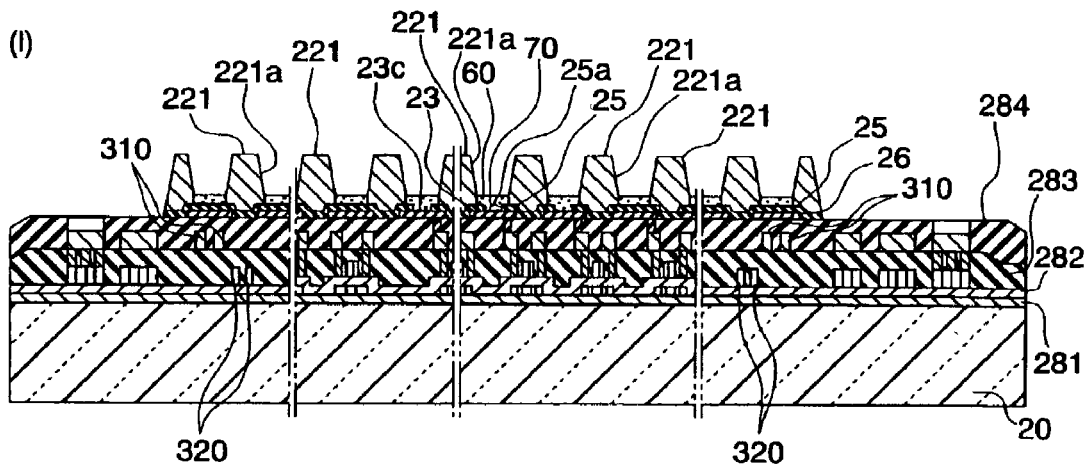
Figure 8:
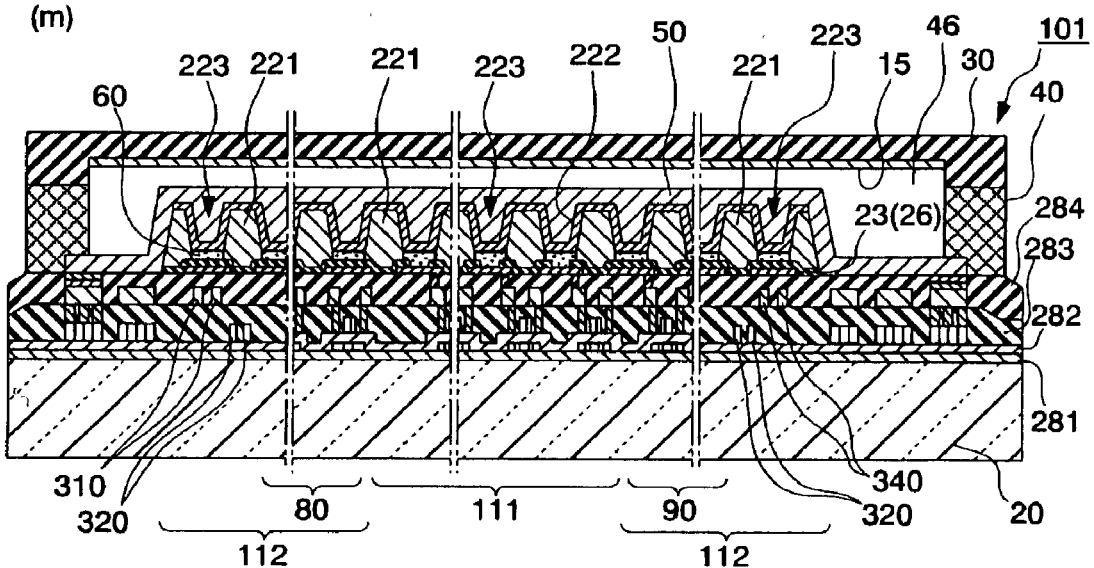

Next, cathodes 222, SO are formed in the subsequent cathode-forming step as in FIG. 8(*m*). In the cathode forming step, a lower cathode layer and an upper cathode layers are formed in order on the overall surface of the light-emitting layer 60 and the organic bank layer 221 to be the cathodes 222, 50 thereon. Preferably, the work function of the material for the lower cathode layer is relatively smaller than that of the upper cathode layer. For example, the material for the cathodes may be lithium fluoride, calcium or aluminium. The upper cathode layer protects the lower cathode layer, and it is desirable that the work function of its material is relatively larger than that of the material for the lower cathode layer. Preferably, these layers are formed, for example, through vapor deposition, sputtering or CVD. Especially preferred for these, is vapor deposition that does not cause thermal damage of the underlying light-emitting layer 60. In FIGS. 8(*k*)–8(*m*), 222 indicates calcium (lower cathode layer), and 50 indicates aluminium (upper cathode layer). Apart from Al, Ag film, Mg/Ag laminate film, etc., may also be used.

Finally, the substrate with the components formed thereon is sealed up with a seal substrate 30 in the sealing step, as shown in FIG. 8(*m*). In the sealing step, the seal substrate 30 and the active matrix substrate 20 are sealed up with an adhesive 40, while a desiccant 15 is inserted inside the seal substrate 30. In the sealing step, it is desirable that the two substrates are sealed up in an inert gas atmosphere of, for example, nitrogen, argon or helium. If the two are sealed up in air, the reflective layer 50 will have defects of pin holes or the like and water and oxygen may penetrate into the underlying cathode 222 through the defects to oxidize the cathode 222.

The fabrication process discussed above provides the display device 101 of FIGS. 1 to 3.

Some examples of the electronic apparatus that includes the display device of the invention are mentioned below.

Figure 9:
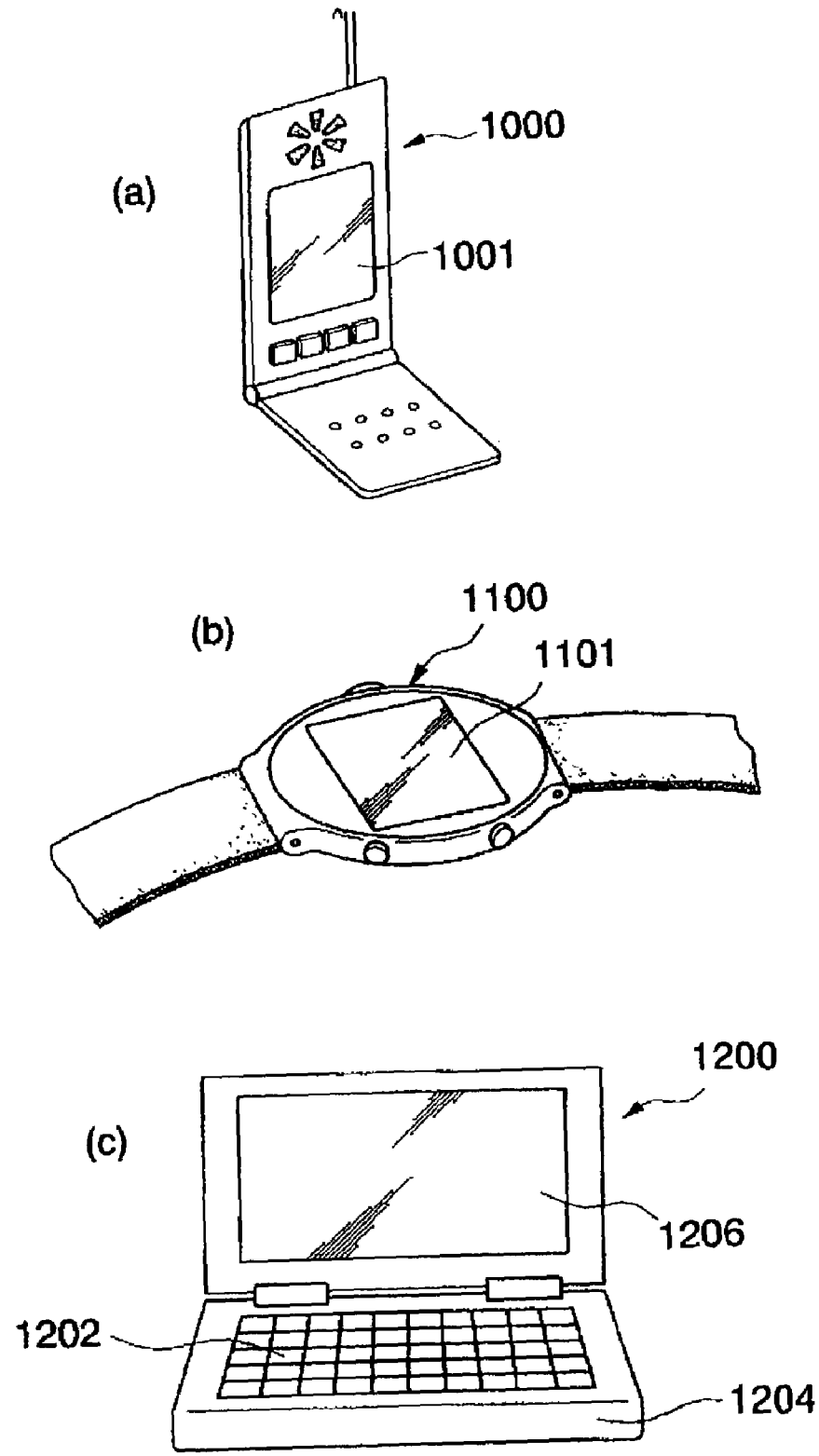
FIGS. 9(a)–9(c) are schematic perspective views showing examples of electronic apparatus including the invention.

FIG. 9(*a*) is a perspective view of a mobile phone. 1000 indicates a mobile phone body, of which 1001 is a display part that includes the display device of the invention.

FIG. 9(b) is a perspective view that shows a wristwatch type electronic apparatus. 1100 indicates a perspective view of a watch body; and 1101 indicates a display part that includes the display device of the invention.

FIG. 9(c) is a perspective view that shows a mobile information processor of, for example, word processors and personal computers. 1200 indicates such an information processor; 1202 indicates the input part thereof, such as a keyboard; 1206 indicates a display part that includes the display device of the invention; and 1204 indicates the information processor body. These exemplary electronic apparatus are driven by batteries and can realize stable power supply thereto as including the constitution of the invention. Most of these electronic apparatus are small sized, and those including the display device of the invention can ensure a relatively large display region, even though they are small sized as a whole.

In the display device of the invention having the constitution specifically defined herein, the specific constitution cancels out the area of the substrate not in display service (drive control signal conduction element and dummy pixel region) to reduce the region of the substrate not for display service, and the effective display region of the substrate is thereby enlarged. In this structure, in addition, since the drive control signal conduction element is superimposed on the barrier region in the plan view of the device, the distance between the cathode layer and the drive control signal conduction element is relatively larger than that in a different case where the element is superimposed on the recess region. Accordingly, in this structure, the capacitance between the cathode layer and the drive control signal conduction element is reduced and the external influence of the thus reduced capacitance on the drive control signals to pass through the device is therefore reduced. Specifically, the pulse signal wave to pass through the device is only deformed a little.

What is claimed is:

1. A display device, comprising:
   a substrate; and
   a display region that serves for display and a non-display region not for display disposed on the substrate, the display region and the non-display region each being aligned in a predetermined matrix pattern of barriers and recesses spaced from each other with the barriers adjacent thereto, the display region including at least a first electrode layer, an essential display layer with a substance switchable for display or non-display therein and a second electrode layer that are aligned around a bottom of each recess in a recess region thereof, in that order, from a side of the substrate;
   the non-display region including at least the essential display layer and the second electrode layer around the bottom of each recess of the recess region in that order from the side of the substrate;
   the substrate being provided thereon with a switch unit connected to the first electrode layer to control electric conduction to the first electrode layer, an operation control unit connected to the switch unit to control the switch unit operation, and a drive control signal conduction element through which a drive control signal passes to drive the operation control unit; and
   the drive control signal conduction element being so aligned as to be at least partly in the non-display region, and in plan view of the substrate, so as to be at least partly superimposed on the barrier region.

2. The display device as claimed in claim 1, the substrate being provided thereon with a driving current conduction element through which the driving current passes to drive the operation control unit, an insulating layer being formed between the driving current conduction element and the second electrode layer and between the drive control signal conduction element and the second electrode layer, and the insulating layer region where the drive control signal conduction element is formed being further from the second electrode than where the driving current conduction element is formed.

3. The display device as claimed in claim 1, the non-display region being provided with a first electrode layer between the substrate and the essential display layer and with an insulating layer to block the electric conduction between the first electrode layer and the second electrode layer.

4. The display device as claimed in claim 3, a surface of the insulating layer being formed of a material of which an affinity for the essential display layer is relatively higher than an affinity of a surface of each barrier.

5. The display device as claimed in claim 1, the substrate being provided thereon with multiple scanning lines and multiple data lines formed to cross each other, the switch unit being formed around intersections of the scanning lines and the data lines, and the operation control unit including a data control unit to control the signal to pass through the data lines.

6. The display device as claimed in claim 1, the substrate being provided thereon with multiple scanning lines and multiple data lines formed to cross each other, the switch unit being formed around intersections of the scanning lines and the data lines, and the operation control unit including a scanning control unit to control the signal to pass through the scanning lines.

7. The display device as claimed in claim 1, the substrate being provided thereon with multiple inspection lines, the switch unit being connected to the inspection lines, and the operation control unit including an inspection control unit to control the signal to pass through the inspection lines.

8. The display device as claimed in claim 1, the essential display layer containing an organic electroluminescent substance.

9. A display device, comprising:
   a substrate; and
   a recess region of multiple recesses spaced from each other with barriers adjacent thereto, the recess region including a display region and a non-display region formed adjacent to the display region, the recess region being formed on the substrate;
   the recess region having at least a light-emitting layer formed therein, and the light-emitting layer being provided with a first electrode layer formed on one surface thereof and a second electrode layer formed on another surface thereof;
   the substrate being provided thereon with a switch unit connected to the first electrode layer to control electric conduction to the first electrode layer, an operation control unit connected to the switch unit to control the switch unit operation, and a driving current conduction element to drive current application to the operation control unit to drive the operation control unit therewith; and
   the driving current conduction element being so aligned as to partly overlap with the barrier region in plan view of the substrate.

10. A display device, comprising:
    a substrate;
    an electro-optical material;

a first electrode layer including a plurality of pixel electrodes that are disposed above the substrate;

a second electrode layer that is disposed above the first electrode layer;

a plurality of switch units each of which is connected to one pixel electrode of the plurality of pixel electrodes;

a scanning-line driving circuit;

a data-line driving circuit;

a control signal conduction element that transmits a control signal controlling one of the scanning-line driving circuit and the data-line driving circuit, a plurality of recesses formed in a first region and a second region, each of the plurality of recesses being spaced from another of the plurality of recesses by a bank, the electro-optical material being disposed in each of the plurality of recesses formed in the first region, and the control signal conduction element overlapping one or more of the banks.

11. The display device according to claim 10, further comprising:

a driving voltage conduction element through which a driving voltage is supplied to one of the scanning-line driving circuit and the data-line driving circuit, the control signal conduction element being formed further from the second electrode layer than the driving voltage conduction element.

12. The display device according to claim 10, the electro-optical material being disposed in the plurality of recesses formed in the second region, the electro-optical material disposed in the plurality of recesses formed in the second region not contributing to display function, and the electro-optical material disposed in the plurality of recesses formed in the first region contributing to a display function.

13. The display device according to claim 10, the electro-optical material being an organic electroluminescent material.

14. A display device, comprising:

a substrate;

an electro-optical material;

a first electrode layer including a plurality of pixel electrodes that are disposed above the substrate;

a second electrode layer that is disposed above the first electrode layer;

a plurality of switch units each of which is connected to one pixel electrode of the plurality of pixel electrodes;

a scanning-line driving circuit;

an inspection control unit that performs inspection; and a control signal conduction element that transmits a control signal controlling one of the scanning-line driving circuit and the inspection circuit, a plurality of recesses being formed in a first region and a second region, each of the plurality of recesses being spaced from another of the plurality of recesses by a bank, the electro-optical material being disposed in each of the plurality of recesses formed in the first region, and the inspection circuit and the control signal conduction element overlapping one or more of the banks.

15. A display device, comprising:

a substrate;

an electro-optical material;

a first electrode layer including a plurality of pixel electrodes that are disposed above the substrate;

a second electrode layer that is disposed above the first electrode layer;

a plurality of switch units each of which is connected to one pixel electrode of the plurality of pixel electrodes;

a scanning-line driving circuit;

an inspection control unit that performs inspection; and a plurality of recesses being formed in a first region and a second region, each of the plurality of recesses being spaced from another of the plurality of recesses by a bank, the electro-optical material being disposed in each of the plurality of recesses formed in the first region, and the inspection circuit overlapping one or more of the banks.

16. The display device according to claim 15, the electro-optical material being disposed in the plurality of second recesses formed in the second region, the electro-optical material disposed in the plurality of recesses formed in the second region not contributing to a display function, and the electro-optical material disposed in the plurality of recesses formed in the first region contributing to the display function.

* * * * *